United States Patent [19]

Thompson et al.

[11] Patent Number: 4,760,580
[45] Date of Patent: Jul. 26, 1988

[54] LASER ARRAY

[75] Inventors: George H. B. Thompson; James E. A. Whiteaway, both of Sawbridgeworth, Great Britain

[73] Assignee: STC PLC, London, England

[21] Appl. No.: 32,779

[22] Filed: Mar. 31, 1987

[30] Foreign Application Priority Data

Jun. 9, 1986 [GB] United Kingdom ............... 8613937

[51] Int. Cl.$^4$ ............................................... H01S 3/19
[52] U.S. Cl. ........................................ 372/50; 372/49; 372/97; 372/108; 350/96.15
[58] Field of Search ............... 350/96.14, 96.13, 96.15, 350/96.16; 372/50, 49, 97, 108

[56] References Cited

U.S. PATENT DOCUMENTS

| 4,578,791 | 3/1986 | Chen | 350/96.16 |
| 4,671,605 | 6/1987 | Soref | 350/96.15 |

FOREIGN PATENT DOCUMENTS 0083980 7/1983 European Pat. Off. .

OTHER PUBLICATIONS

Welch et al. "In phase emission from Index Guided Laser Array up to 400 MW" Electronics Letters, vol. 22, No. 6, pp. 293-294 (13 Mar. 1986).

Taneya et al. "O" phase mode operation in phased-array laser diode with symmetrically brenching waveguide", Applied Physics Letters, vol. 47, No. 4.**

Yaeli et al. "Array mode selection utilizing an external cavity configuration" Applied Physics Letters, vol. 47, No. 2 pp. 89-91 (15 Jul. 1985).

Patent Abstracts of Japan, vol. 6, No. 95 (E-110) (973) 3rd Jun. 1982; JP-A-57 28 382 (Tokyo ShiGaura Denki KK) 16-02-1982.

Primary Examiner—James W. Davie
Assistant Examiner—Georgia Y. Epps
Attorney, Agent, or Firm—Lee & Smith

[57] ABSTRACT

An injection laser array has $2^n$ output elements (1) coupled by Y couplers (2, 4, 6) and (n-1) in sets of intermediate elements to a single element (7) in a tree configuration. The face end of the single element is provided with a high reflectivity coating (8) while those of the $2^n$ output elements are provided with low a reflectivity coating (9).

6 Claims, 2 Drawing Sheets

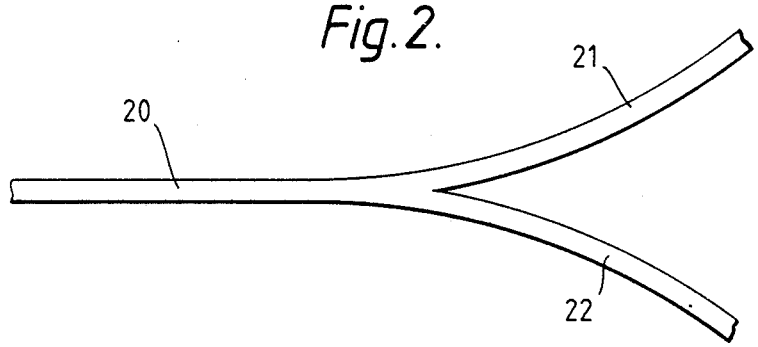
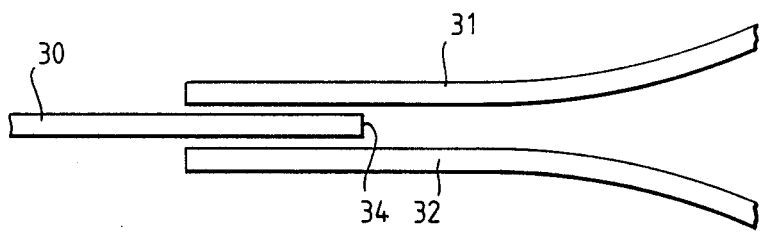

LASER ARRAY

BACKGROUND OF THE INVENTION

This invention relates to laser arrays. A side-by-side array of n parallel identical injection single-mode waveguide laser elements with a close enough spacing to provide significant mutual evanescent coupling between adjacent elements, hereinafter referred to as an evanescent coupled array, has been found typically to have a higher lasing threshold for the zero order supermode in which the light is in phase in all the elements than for the $(n-1)^{th}$ order supermode in which the light propagates down each element in antiphase with that propagating in its two immediately adjacent elements. The zero order supermode, which has a single-lobed far field pattern, is generally preferred to the $(n-1)^{th}$ order supermode, which has a twin-lobed far field pattern. The design of such arrays can be modified to provide the zero order supermode with the lowest threshold, but it is generally found that operation of the zero order supermode tends to be unstable due primarily to self-focusing effects. The $(n-1)^{th}$ order supermode is by contrast much more stable because it does not end to self-focus. It is therefore possible in principle to design laser arrays that should radiate stably in the $(n-1)^{th}$ order supermode to high output powers. More detailed investigation of examples of such designs has, however, suggested that supermode stability is still sensitive to perturbations of the transverse built-in waveguide. In particular the small gain differences between the various supermodes with the highest gains can lead to solutions which oscillate between two or more supermodes.

An alternative design of injection laser array, hereinafter referred to as a Y-coupled array, is disclosed in United Kingdom patent specification GB No. 2163001A (inventors M. Taneya et al) in which a first set of n elements are coupled to a set of $(n+1)$ elements by means of a set of $(2n-1)$ Y couplers. An article entitled '0° phase mode operation in phase-array laser diode with symmetrically branching waveguide', by M. Taneya et al, appearing in Applied Physics Letters Vol. 47 No. 4 pp341-3 (15th Aug. 1975) describes the most basic form of Y-coupled array in which the first set of elements comprises only a single element $(n=1)$, whereas a Y-coupled array with a larger number of elements is described by D. F. Welsh et al in an article entitled 'In-phase emission from index guided laser array up to 400 mm' appearing in Electronics Letters Vol. 22 No. 6 pp293-4 (13th Mar. 1986). In such arrays the Y couplers serve to discriminate in favour of the zero order supermode because light propagating in phase into the two upper limits of an upright Y is guided out of the coupler via the stem of the Y whereas any out-of-phase component is beyond cut-off, and hence radiates out from the stem.

For any Y-coupled array for which $n \geq 2$ it is to be noted that each of the intermediate elements of the set of $(n+1)$ elements is coupled by Y couplers to two neighbouring elements in the set of n elements, whereas each of the outermost two elements of the array of $(n+1)$ elements is coupled to only one element of the set of n elements, and therefore has only half the photon density of the intermediate elements. This will lead to a progressive difference in optical path length between that of the outermost elements and that of the intermediate elements as the drive current is increased. Eventually the phase difference that this engenders can be expected to feed back across the array and lead to a distorted radiated phase front, and even perhaps the generation of a higher order supermode. In principle it could be possible to modify the width and guiding strength of the two outermost elements so as to provide them with inreased photon density to match that of the intermediate elements, and so achieve carrier density clamping across the full width of the array above threshold. In practice, however, this would be difficult to achieve because it would involve knowledge of the precise guide strength remaining after taking into account the effects of carriers.

SUMMARY OF THE INVENTION

An object of the present invention is to provide an array structure in which the aforementioned differential drive problems are avoided.

In particular the present invention is concerned with a laser array where the coupling is similarly effected by means of Y-couplers, but in which the splitting of power is arranged in a tree configuration.

According to the preset invention there is provided a branched tree laser array having a set of $2^n$ output single mode waveguide laser elements optically coupled, by means of 3-port single mode Y-couplers via one or more sets of intermediate single mode waveguide laser elements, with a single single-mode waveguide element, wherein the lateral separation of the elements within each set is sufficient to provide no significant mutual evanescent coupling between adjacent members of the set, and wherein the distal end of the single element and that of each member of the set of output elements, are provide respectively with relatively high and relatively low reflectivities whose values are such that, at lasing threshold, the optical gain in each member of the sets of output and intermediate elements is substantially equal to 2.

It can be seen that a feature of this tree configuratin is that the two outermost elements of the output elements have exactly the same drive as that applied to the intervening members of the set of output elements. Similarly in each set of intermediate elements the drive to the outermost two elements of that intermediate set is no different from the drive applied to the intervening elements of that set.

BRIEF DESCRIPTION OF THE DRAWINGS

There follows a description of a tree configuration injection laser array embodying the invention in a preferred form. The description refers to the accompanying drawings in which:

FIGS. 2 and 3 are diagrams of alternative forms of 7 coupler that may be used in the array of FIG. 1.

DETAILED DESCRIPTION OF THE PREFERRED EMBODIMENT

Figure 1:
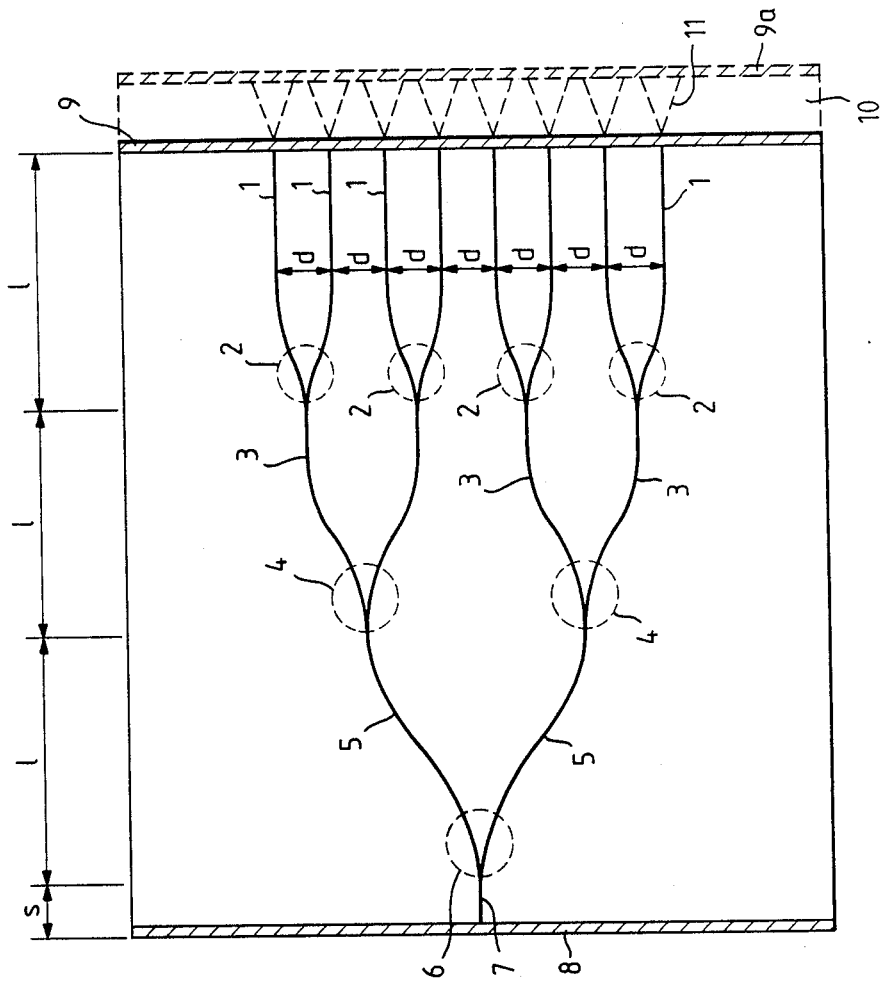
FIG. 1 is a schematic diagram of a branched tree laser array with 8 output elements.

A branched tree laser array according to the invention has $2^n$ output elements, where n is a positive integer equal to or greater than 2. For illustrative convenience FIG. 1 of the accompanying drawings depicts an array with a set of eight identical output elements 1 (i.e. in this example $n=3$). These eight output elements are equi-spaced with a lateral spacing 'd' which is large enough to prevent any significant mutual coupling between adjacent elements via their evanescent fields. The set of eight output elements 1 are coupled by means of four Y couplers 2 to a set of four identical intermediate elements 3, which in turn are coupled by two Y-couplers 4 to a set of two identical intermediate elements 5. In their turn the two intermediate elements 5 are coupled by a Y-coupler 6 to a single element 7. The Y-couplers 2, 4 and 6 and the elements 1, 3, 5 and 7 are all single mode optical waveguiding elements at the laser emission wavelength.

The distal end of the single element 7 is rendered relatively highly reflecting, for instance by means of a high reflectivity interference filter stack 8 at the rear facet of the array, while the distal ends of the set of eight output elements 1 are rendered relatively low reflectivity, for instance by means of a low reflectivity interference filter stack 9 at the front facet of the array. A feature of branched tree laser arrays according to this invention is that the reflectivities are chosen in relation to the geometry of the array so that, at the lasing threshold, the optical gain in each member of the sets of output and intermediate elements is substantially equal to 2. Generally it will be convenient for the drive to be the same for each of these elements, in which case they need to be of substantially equal optical path length if they are to be of identical cross-section. Typically, the single element 7 will have a cross-section identical with that of all the other elements, but will not be as long. This element needs to be long enough to provide adequate attenuation of any antiphase component of light fed into it from the two intermediate elements 5. Typically 20 to 30 μm are adequate for this purpose. Additional length provides additional gain for the structure which in turn means that, if the gain in the other element is to be maintained at 2, the reflectivity has to be reduced at at least one of the facets. Reduction of reflectivity at the rear facet is undesirable because it reduces efficiency. Reduction of reflectivity at the front facet may be difficult to achieve, particularly in the case of trees with a relatively large number of elements because, even with a gain not significantly greater than unity for the single element, the reflectivity required for the front facet is already quite low.

As explained previously, the reflectivity for the rear facet should, for reasons of efficiency, be maintained as high as conveniently possible. Typically this means that an optical power reflectivity of about 0.95 is provided at this facet. Having regard to the fact that at lasing threshold there is unit round trip gain, it can be shown that under these conditions, and under the assumptions that the single element exhibits unity gain and the other elements a gain of 2, the required reflectivities for the output facet respectively for arrays of 2, 4, 8 and 16 output elements are as listed in the accompanying table. (The array having only two output elements does not fall within the scope of the present invention, and details concerning its properties are provided merely for comparison purposes).

A feature of arranging for a gain substantially equal to two for all elements other than the single element is that the optical power levels in any member of the set of output elements is roughly comparable with that of any member if any of the sets intermediate elements, and thus the array is relatively uniformly stressed. High power lasers are typically susceptible to problems of gain saturation near the ends of an optical cavity where the increase in photon density becomes limited by the finite current density being applied to the device, but in this structure gain saturation is less of a problem than in some other designs because there is a continual dilution of the photon density by the fanning out of the array, and current is injected principally in the region where it is most required, namely in the high intensity and current injection is unevenly distributed down the array with more current injected in relatively high optical intensity regions near the output facet than in regions of lower optical intensity situated further away.

In general the electric field strength at the laser facets is an important consideration in determining device reliability, particularly for devices fabricated in GaAlAs. If an electric field $E_i$ is incident on a facet with a field reflectivity 'r', then the field strength at that facet is $E_i(1+r)$. In the case of a branched tree array with a gain of 2 for all elements other than the single element, the rate of the field strength at the two facets is given by the expression $$E_{front}/E_{rear} = 2^{0.5} (1 + r_{front}) \cdot |r_{rear}|/(1 + r_{rear}).$$

Assuming $r_{rear} = -(0.95)^{0.5}$, $E_{front}/E_{rear} = 54.4 (1+r_{front})$. The accompanying table also lists the calculated ratios for the four arrays. The combination of a rear facet near total reflector and a front facet anti-reflector is seen to introduce more than a factor of 50 higher field at the front facet. On a much more conservative basis power density incident on a facet might be considered to be the relevant parameter determining reliability. The ratio of the power density at the front to the rear facet is $2.R_{rear}$, or 1.90, for all the arrays of Table 1. Hence on either count the front facet would be expected to suffer damage before the rear.

Using the electric field strength at the front facet as an indication of the degradation hazard, it is possible to calculate the relative power output of each design normalised to that from a single uncoated emitter. The power transmitted through a facet is proportional to $E_i^2(1-r^2)$. However the field at the facet is $E_i(1+r)$, so the power handling capability of a single emitter is proportional to $(1-r^2)/(1+r^2)$. Table 1 shows that, from the reliability point of view, the output capability of the tree array increases superlinearly from 4.3 to 54.1 times that of a single uncoated emitter as the number of output elements increases from 2 to 16 respectively. A half wavelength coated single emitter might be expected to give twice the output of an uncoated device. Hence these calculated margins of the tree array over a single uncoated emitter would then change to 2.1 to 27.0 over a half wavelength coated emitter for arrays with 2 to 16 output elements respectively. It is to be noted that a higher front facet reflectivity than specified in Table 1 results in a reduction in the ratio of the maximum power incident on the front facet to that on the rear. This arises since the power relfected from the front facet is amplified and concentrated back on the single element at the rear facet. Care therefore needs to be taken in achieving the desired front facet reflectivity.

An important consideration in designing a tree array is the maximum radius of curvature in the connecting guides that can be used without introducing unacceptable bending (radiation) losses. For strong ridge guides it is typically found that a 300 μm radius of curvature will prevent significant losses. If care is also taken in reducing scattering due to guide wall roughness, then losses down to 4.9 cm$^{-1}$ can be obtained on 300 μm radius bends. This loss is less than that due to free carrier absorption in a typical laser waveguide. A tree array will, however, typically employ noticeably weaker guides that will necessitate larger radii of curvature, typically of the order of 1.5 mm.

Once the radius of curvature of the curved sections of the array has been specified it is possible to estimate the total length of the array. The longest curved section is that between the Y coupler at the end of the first element and the Y couplers at the ends of the next two elements. This curve is formed by equal lengths of positive and negative curvature to give the requisite displacement from the centre line. In the case of an array having $2^n$ output elements on a pitch of 'd', it can be seen that the combination of the positive curvature component with the negative curvature component, both of radius 'a', is required to produce a displacement of $2^{(n-2)}d$. From the intersecting chord theorem it follows that the other length 'l' of this section is given by $$(2^n \cdot d \cdot a)^{0.5}$$

Succeeding sections do not have to provide as much displacement, and so are made up of shorter arcs of the same radius of curvature, and the individual sections are made up to the same total length with straight portions. If the length of the first section 's' is short enough to be neglected, the approximate overall length of the array, nl, is given by $$n(2^n \cdot d \cdot a)^{0.5}$$

The accompanying table lists approximate lengths for the arrays as calculated for an output element pitch 'd' of 10 $\mu$m and a radius of curvature 'a' of 1.5 mm.

The spacing of the elements within each section is designed to provide no significant mutual evanescent coupling because it is this coupling that is liable to introduce instabilities. However it will be appreciated that there will inevitably be a certain measure of evanescent coupling where the elements approach each other in the Y couplers. If this residual evanescent coupling is still large enough to introduce instability problems, such problems can be overcome by arranging for these regions to be transparency in the absence of electrical pumping. It will be appreciated that this is effective because the instability results from interaction between the light and the carriers in the region of evanescent coupling rather than from the evanescent coupling itself. By making such regions transparent in the absence of electrical pumping the interaction is removed. One convenient way in which the requisite localised transparent can be achieved is by IID (impurity induced disordering).

The relatively large separation of the output elements at the output facet can be a disadvantage. One way of reducing this effect is to flare the individual elements to greater width as they approach the output facet. This will produce additional evanescent coupling, and so it may be preferred to arrange for part or all of these flares to be accommodated in a region which is transparent in the absence of electrical pumping. In FIG. 1 there is depicted in broken outline a modified version of the array in which the array has been lengthened by the addition of a transparent region 10 accommodating the flared regions 11. In this instance the low reflectivity facet is moved from 9 to 9a. An abrupt step to increased width may alternatively be used in place of a flared region without inreasing too much additional loss.

The Y-couplers are 3-port devices arranged so that optical power fed into one port is divided equally between the other two ports acting as output ports. Conversely light fed in-phase into the two ports last-mentioned is combined for feeding out of the first-mentioned port. One physical form that such a coupler can take is that of a single single mode waveguide 20 (FIG. 2) divides at a small angle into two single mode waveguides 21, 22. An alternative form is provided by a balanced directional coupler configuration in which the first waveguide 30 (FIG. 3) terminates in a region where it is symmetrically flanked on both sides by the starts of two other waveguides 31, 32.

The overlapping of the waveguides is such that power launched into the Y coupler via waveguide 30 is fully coupled equally into the other two waveguides so that there is none to be reflected at the end 34 of the first waveguide. Similarly, operating in the reverse direction, in-phase power launched into the two waveguides 31, 32 is completely transferred to the waveguide 30 that extends from between them.

TABLE

| No. of output elements | 2 | 4 | 8 | 16 |
|---|---|---|---|---|
| No. of couplers | 1 | 5 | 7 | 15 |
| Front facet power reflectivity | 0.2632 | 0.0658 | 0.0164 | 0.0041 |
| Field at front facet/Field at rear facet | 68.5 | 61.5 | 58 | 56.2 |
| Output normalised to standard uncoated element | 4.3 | 11.1 | 25.4 | 54.1 |
| Approximate total length* ($\mu$m) | 200 | 500 | 1100 | 2000 |

*Assuming 1.5 mm radius of curvature and 10 $\mu$m output element spacings.

We claim:

1. A branched tree laser array having, supported upon a single semiconductor substrate, a set of $(2^{n+1}-1)$ single mode waveguide injection laser elements provided with an electrode and a counter-electrode common to all members of the set, which $(2^{n+1}-1)$ members of the set are arranged on the substrate in a branched tree array and comprise a set of $2^n$ output single mode waveguide laser elements optically coupled, by means of 3-port single mode Y-couplers via one or more sets of intermediate single mode waveguide laser elements, with a single single-mode waveguide element, wherein the lateral separation of the elements within each set is such as to provide no significant mutual evanescent coupling between adjacent members of the set, and wherein first and second means are provided respectively at the distal end of the single element and that of each member of the set of output elements to produce a value of reflectivity for the distal end of the single element high compared with that produced for the distal ends of the members of the set of output elements, which values are chosen in relation to the configuration of the laser elements such that, at lasing threshold, the optical gain in each member of the sets of output and intermediate elements is substantially equal to 2.

2. An array as claimed in claim 1, wherein the output elements are outwardly flared or stepped towards their distal ends.

3. An array as claimed in claim 1, wherein one or more of the 3-port Y-couplers are located in regions that are transparent to the laser radiation in the absence of electrical pumping.

4. An array as claimed in claim 3, wherein the output elements are outwardly flared or stepped towards their distal ends.

5. An array as claimed in claim 4, wherein at least the distal ends of the flares or stepped regions on the ends of the output elements are located in regions that are transparent to the laser radiation in the absence of electrical pumping.

6. In a laser array comprising a set of optically coupled single mode waveguide laser elements, the improvement comprising arranging the elements in a branched tree array having a set of $2^n$ output single mode waveguide laser elements optically coupled, by means of 3-port single mode Y-couplers via one or more sets of intermediate single mode waveguide laser elements, with a single single-mode waveguide element, wherein the lateral separation of the elements within each set is such as to provide no significant mutual evanescent coupling between adjacent members of the set, and herein first and second means are provided respectively at the distal end of the single element and that of each member of the set of output elements to produce a value of reflectivity for the distal end of the single element high compared with that produced for the distal ends of the members of the set of output elements, which values are chosen in relation to the configuration of the laser elements such that, at lasing threshold, the optical gain in each member of the sets of output and intermediate elements is substantially equal to 2.

* * * * *